United States Patent
Fujii et al.

(10) Patent No.: US 12,342,469 B2
(45) Date of Patent: Jun. 24, 2025

(54) MANAGEMENT DEVICE, MOUNTING SYSTEM, AND MANAGEMENT METHOD

(71) Applicant: FUJI CORPORATION, Chiryu (JP)

(72) Inventors: Shinichi Fujii, Nagoya (JP); Yuhei Inoue, Higashiura-cho (JP); Satoshi Sonoda, Chiryu (JP); Yusuke Kikuchi, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 239 days.

(21) Appl. No.: 17/905,808

(22) PCT Filed: Mar. 16, 2020

(86) PCT No.: PCT/JP2020/011477
§ 371 (c)(1),
(2) Date: Sep. 7, 2022

(87) PCT Pub. No.: WO2021/186502
PCT Pub. Date: Sep. 23, 2021

(65) Prior Publication Data
US 2023/0422459 A1 Dec. 28, 2023

(51) Int. Cl.
*H05K 13/08* (2006.01)
*G05B 19/402* (2006.01)
(52) U.S. Cl.
CPC ......... *H05K 13/086* (2018.08); *G05B 19/402* (2013.01); *G05B 2219/39359* (2013.01)
(58) Field of Classification Search
CPC ........ G05B 19/402; G05B 2219/39359; H05K 13/085; H05K 13/086
See application file for complete search history.

(56) References Cited

U.S. PATENT DOCUMENTS

| 2003/0106207 A1* | 6/2003 | Terui ................. H05K 13/0061 29/742 |
| 2005/0284653 A1* | 12/2005 | Okayama ............ H05K 3/0005 174/250 |

(Continued)

FOREIGN PATENT DOCUMENTS

| WO | WO 2019/176038 A1 | 9/2019 |
| WO | WO 2020/026379 A1 | 2/2020 |

OTHER PUBLICATIONS

International Search Report Issued Jun. 2, 2020, in PCT/JP2020/011477, filed on Mar. 16, 2020, 2 pages.

*Primary Examiner* — Tameem D Siddiquee
(74) *Attorney, Agent, or Firm* — Oblon, McClelland, Maier & Neustadt, L.L.P.

(57) ABSTRACT

A management device used in a mounting system including multiple mounting-related devices in which a member is attached to one or more attachment sections, and a moving work device that moves between the multiple mounting-related devices to automatically attach and detach the member to and from the attachment sections, the management device including, when acquiring prohibition information including information on the attachment sections to and from which the member is not attachable and detachable by the moving work device from the mounting-related device, a management control section that creates an instruction list based on the prohibition information, in which an attachment and detachment instruction of the member for the attachment sections other than the attachment sections to and from which the member is not attachable and detachable is registered, and causes the moving work device to execute attachment and detachment processing of the member based on the instruction list.

6 Claims, 7 Drawing Sheets

(56) References Cited

U.S. PATENT DOCUMENTS

2013/0223001 A1* 8/2013 Ryu ................... G06F 1/185
           361/774
2020/0037480 A1* 1/2020 Hirayama ............ H05K 13/021

* cited by examiner

Fig. 6

| WORK NUMBER | DEVICE | ATTACHMENT UNIT | ATTACHMENT SECTION NUMBER | WORK CONTENT | FEEDER ID | NAME OF COMPONENT HELD | NUMBER OF REMAINING COMPONENTS | |
|---|---|---|---|---|---|---|---|---|
| 1 | STORAGE DEVICE | STORING | #2 | COLLECT | H | Part1 | *** | ~86 |
| 2 | STORAGE DEVICE | STORING | #5 | COLLECT | I | Part2 | *** | |
| 3 | STORAGE DEVICE | STORING | #13 | COLLECT | J | Part5 | ** | |
| 4 | STORAGE DEVICE | STORING | #19 | COLLECT | K | Part5 | ** | |
| 5 | MOUNTING DEVICE 1 | BUFFERING | #4 | ATTACH | H | Part1 | *** | |
| 6 | MOUNTING DEVICE 1 | BUFFERING | #5 | ATTACH | I | Part2 | *** | |
| 7 | MOUNTING DEVICE 5 | MOUNTING | #7 | COLLECT | L | Part6 | *** | OUTSIDE MOVABLE RANGE |
| 8 | MOUNTING DEVICE 5 | MOUNTING | #8 | COLLECT | M | Part6 | *** | |
| 9 | MOUNTING DEVICE 3 | MOUNTING | #1 | ATTACH | J | Part5 | ** | |
| 10 | MOUNTING DEVICE 3 | MOUNTING | #2 | ATTACH | K | Part5 | ** | |
| 11 | STORAGE DEVICE | STORING | #2 | ATTACH | L | Part6 | *** | RELATED TO WORK NUMBERS 7 AND 8 |
| 12 | STORAGE DEVICE | STORING | #5 | ATTACH | M | Part6 | *** | |
| ⋮ | ⋮ | ⋮ | ⋮ | ⋮ | ⋮ | ⋮ | ⋮ | |

| WORK NUMBER | DEVICE | ATTACHMENT UNIT | ATTACHMENT SECTION NUMBER | WORK CONTENT | FEEDER ID | NAME OF COMPONENT HELD | NUMBER OF REMAINING COMPONENTS | |
|---|---|---|---|---|---|---|---|---|
| 1 | STORAGE DEVICE | STORING | #2 | COLLECT | H | Part1 | *** | ~86 |
| 2 | STORAGE DEVICE | STORING | #5 | COLLECT | I | Part2 | *** | |
| 3 | STORAGE DEVICE | STORING | #13 | COLLECT | J | Part5 | ** | |
| 4 | STORAGE DEVICE | STORING | #19 | COLLECT | K | Part5 | ** | |
| 5 | MOUNTING DEVICE 1 | BUFFERING | #4 | ATTACH | H | Part1 | *** | |
| 6 | MOUNTING DEVICE 1 | BUFFERING | #5 | ATTACH | I | Part2 | *** | |
| 9 | MOUNTING DEVICE 3 | STORING | #1 | ATTACH | J | Part5 | ** | |
| 10 | MOUNTING DEVICE 3 | STORING | #2 | ATTACH | K | Part5 | ** | |
| ⋮ | ⋮ | ⋮ | ⋮ | ⋮ | ⋮ | ⋮ | ⋮ | |

Fig. 7

| WORK NUMBER | DEVICE | ATTACHMENT UNIT | ATTACHMENT SECTION NUMBER | WORK CONTENT | FEEDER ID | NAME OF COMPONENT HELD | NUMBER OF REMAINING COMPONENTS | |
|---|---|---|---|---|---|---|---|---|
| 1 | STORAGE DEVICE | STORING | #2 | COLLECT | H | Part1 | *** | ~86 |
| 2 | STORAGE DEVICE | STORING | #5 | COLLECT | I | Part2 | *** | |
| 3 | STORAGE DEVICE | STORING | #13 | COLLECT | J | Part5 | ** | ← NOT EXECUTABLE |
| 4 | STORAGE DEVICE | STORING | #19 | COLLECT | K | Part5 | ** | |
| 5 | MOUNTING DEVICE 1 | BUFFERING | #4 | ATTACH | H | Part1 | *** | |
| 6 | MOUNTING DEVICE 1 | BUFFERING | #5 | ATTACH | I | Part2 | *** | |
| 7 | MOUNTING DEVICE 5 | MOUNTING | #7 | COLLECT | L | Part6 | *** | |
| 8 | MOUNTING DEVICE 5 | MOUNTING | #8 | COLLECT | M | Part6 | *** | |
| 9 | MOUNTING DEVICE 3 | MOUNTING | #1 | ATTACH | J | Part5 | ** | ← RELATED TO WORK NUMBER 3 |
| 10 | MOUNTING DEVICE 3 | MOUNTING | #2 | ATTACH | K | Part5 | ** | |
| 11 | STORAGE DEVICE | STORING | #2 | ATTACH | L | Part6 | *** | |
| 12 | STORAGE DEVICE | STORING | #5 | ATTACH | M | Part6 | *** | |
| ⋮ | ⋮ | ⋮ | ⋮ | ⋮ | ⋮ | ⋮ | ⋮ | |

| WORK NUMBER | DEVICE | ATTACHMENT UNIT | ATTACHMENT SECTION NUMBER | WORK CONTENT | FEEDER ID | NAME OF COMPONENT HELD | NUMBER OF REMAINING COMPONENTS | |
|---|---|---|---|---|---|---|---|---|
| 1 | STORAGE DEVICE | STORING | #2 | COLLECT | H | Part1 | *** | ~86 |
| 2 | STORAGE DEVICE | STORING | #5 | COLLECT | I | Part2 | *** | |
| 5 | MOUNTING DEVICE 1 | BUFFERING | #4 | ATTACH | H | Part1 | *** | |
| 6 | MOUNTING DEVICE 1 | BUFFERING | #5 | ATTACH | I | Part2 | *** | |
| 7 | MOUNTING DEVICE 5 | MOUNTING | #7 | COLLECT | L | Part6 | *** | |
| 8 | MOUNTING DEVICE 5 | MOUNTING | #8 | COLLECT | M | Part6 | *** | |
| 11 | STORAGE DEVICE | STORING | #2 | ATTACH | L | Part6 | *** | |
| 12 | STORAGE DEVICE | STORING | #5 | ATTACH | M | Part6 | *** | |
| ⋮ | ⋮ | ⋮ | ⋮ | ⋮ | ⋮ | ⋮ | ⋮ | |

MANAGEMENT DEVICE, MOUNTING SYSTEM, AND MANAGEMENT METHOD

TECHNICAL FIELD

The present specification relates to a management device, a mounting system, and a management method.

BACKGROUND ART

Conventionally, a mounting system including an in-line storage and multiple mounting machines on which a feeder that supplies a component is mounted in respective slots, and a loader that moves between the in-line storage and the multiple mounting machines to automatically attach and detach the feeder to and from the respective slots has been proposed (refer to Patent Literature 1, for example). In this mounting system, an instruction list in which multiple attachment and detachment instructions of the feeder to the slots are registered is created, and an exchange instruction of the feeder is output to the loader and the display of the mounting machines based on the created instruction list. As a result, the attachment and detachment of the feeder can be performed not only by the loader but also by an operator. Then, in this mounting system, when the feeder is attached to and detached from the slots of the mounting machines, when the attachment and detachment is in accordance with the attachment and detachment instructions of the instruction list, the corresponding attachment and detachment instructions are deleted from the instruction list, whereas when the attachment and detachment is not in accordance with the attachment and detachment instructions, the corresponding processing is executed so that the attachment and detachment is in accordance with the attachment and detachment instructions.

PATENT LITERATURE

Patent Literature 1: WO 2020/026379

BRIEF SUMMARY

Technical Problem

In the mounting system described above, the feeder may not be attached to and detached from a part of the slots by the loader due to an instruction from the operator or the state of the slots. In this case, if an attachment and detachment instruction of the feeder to the slots is included in the instruction list described above, the loader may not be able to operate in accordance with the instruction list and stop.

It is a main object of the present disclosure to provide a management device, a mounting system, and a management method capable of suppressing unintentional stoppage of a moving work device.

Solution to Problem

The present disclosure employs the following means in order to achieve the above-mentioned main object.

A management device of the present disclosure is a management device used in a mounting system including multiple mounting-related devices in which a member related to mounting of a component is attached to one or more attachment sections, and a moving work device that moves between the multiple mounting-related devices to automatically attach and detach the member to and from the attachment sections, the management device including a management control section configured to, when acquiring prohibition information including information on the attachment sections to and from which the member is not attachable and detachable by the moving work device from the mounting-related device, create an instruction list based on the prohibition information, in which an attachment and detachment instruction of the member for the attachment sections other than the attachment sections to and from which the member is not attachable and detachable is registered, and causes the moving work device to execute attachment and detachment processing of the member based on the instruction list.

In the management device of the present disclosure, when acquiring prohibition information including information on the attachment sections to and from which the member is not attachable and detachable by the moving work device from the mounting-related device, an instruction list is created based on the prohibition information, in which an attachment and detachment instruction of the member for the attachment sections other than the attachment sections to and from which the member is not attachable and detachable is registered, and the moving work device is caused to execute attachment and detachment processing of the member based on the instruction list. Therefore, since the instruction list does not include an attachment and detachment instruction of the member for the attachment sections to and from which the member is not attachable and detachable, it is possible to suppress the unintentional stoppage of the moving work device. Here, the mounting-related device includes, for example, a printing device that prints a viscous fluid on a processing target object, a print inspection device that inspects a printing state or the like, a mounting device that mounts a component, a mounting inspection device that inspects a mounting state or the like, a storage device that stores members used in other mounting-related devices, a conveyance device of the processing target object, a reflow device that performs reflow processing, and the like. Examples of the processing target object include a substrate and a substrate having a three-dimensional structure.

BRIEF DESCRIPTION OF DRAWINGS

FIG. 6 is an explanatory diagram illustrating an example of a state in which instruction list information 86 is created.

FIG. 7 is an explanatory diagram illustrating an example of a state in which instruction list information 86 is created.

DESCRIPTION OF EMBODIMENTS

Figure 1:
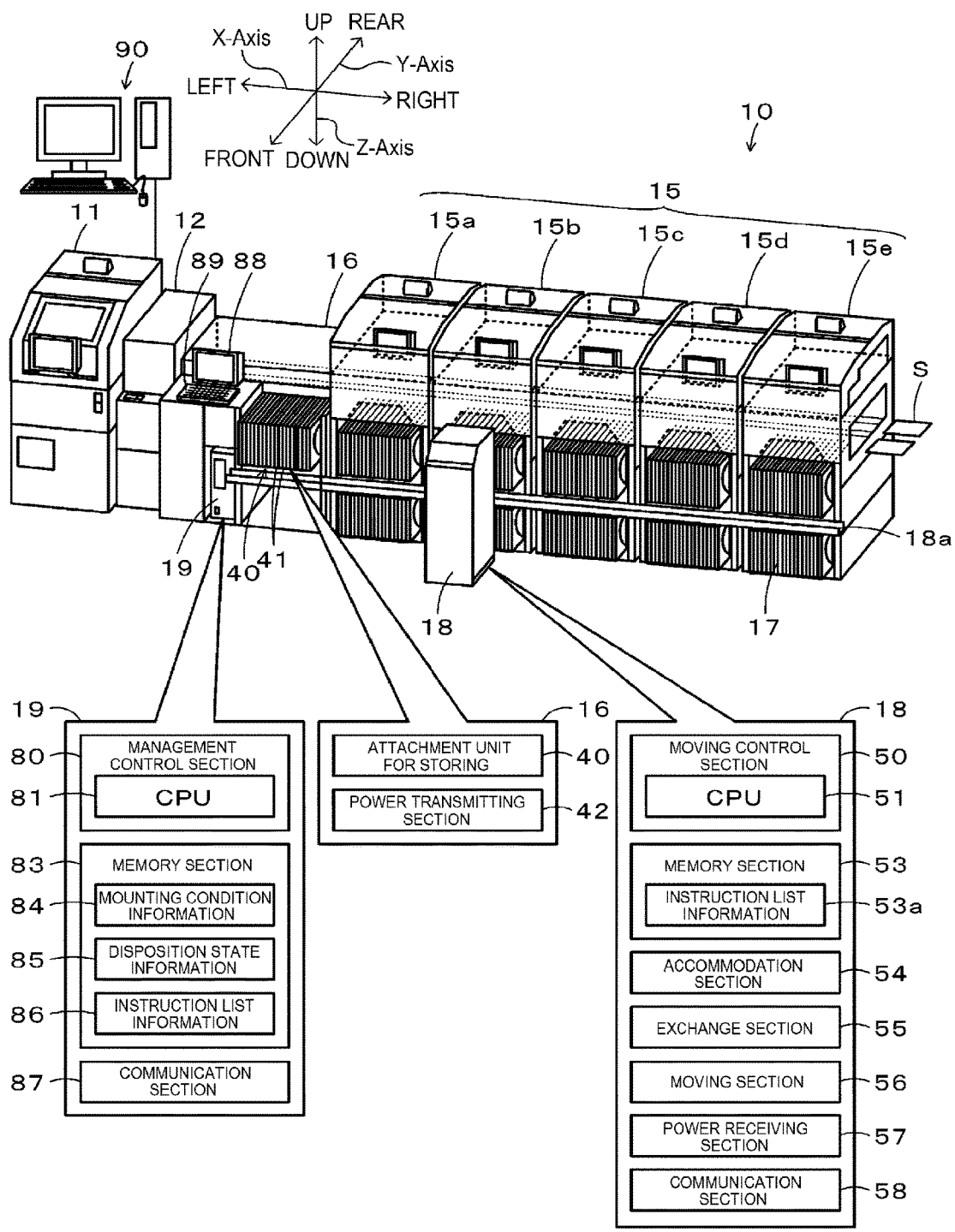
FIG. 1 is a configuration diagram schematically illustrating a configuration of mounting system 10.
Figure 2:
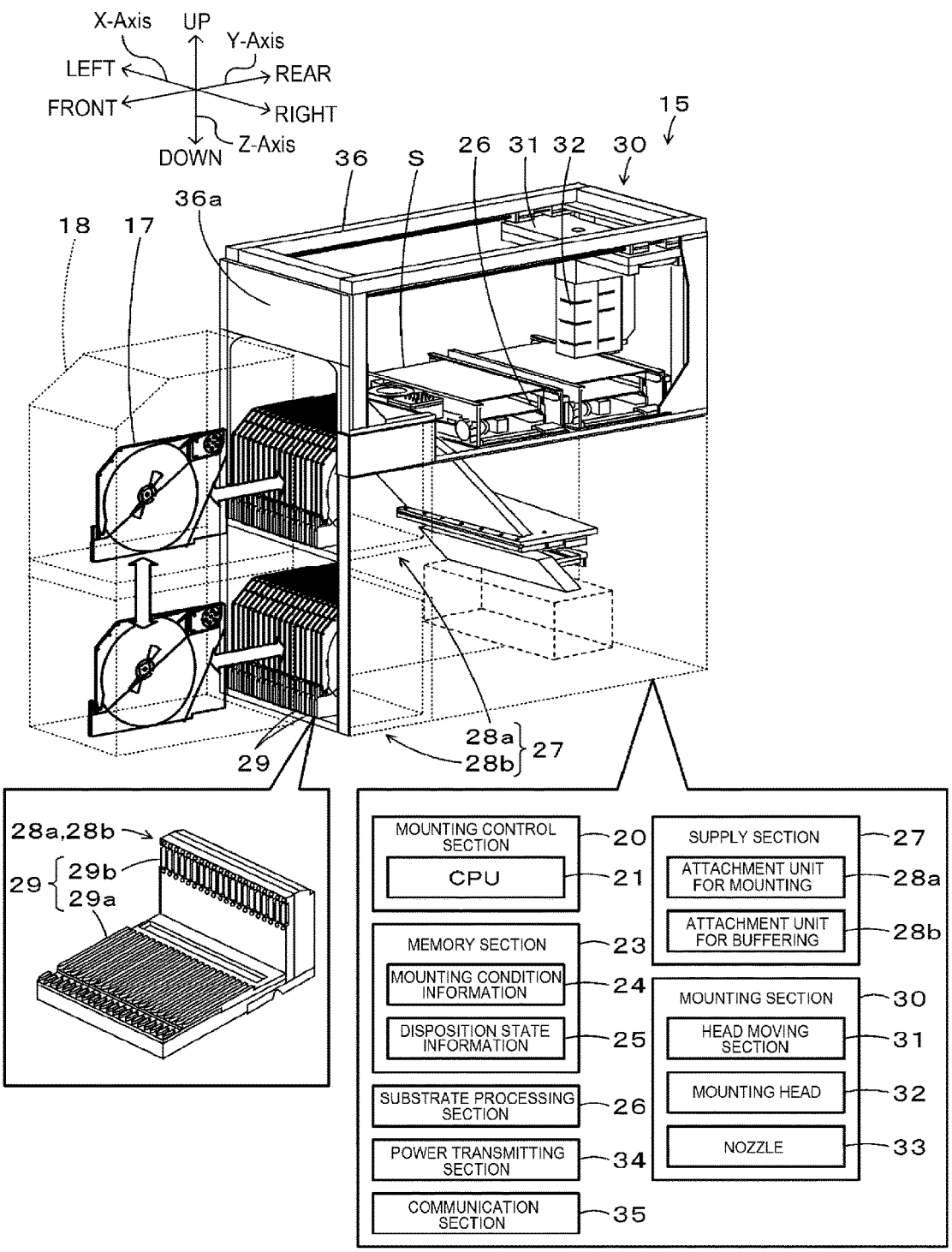
FIG. 2 is a configuration diagram schematically illustrating a configuration of mounting device 15 and loader 18.
Figure 3:
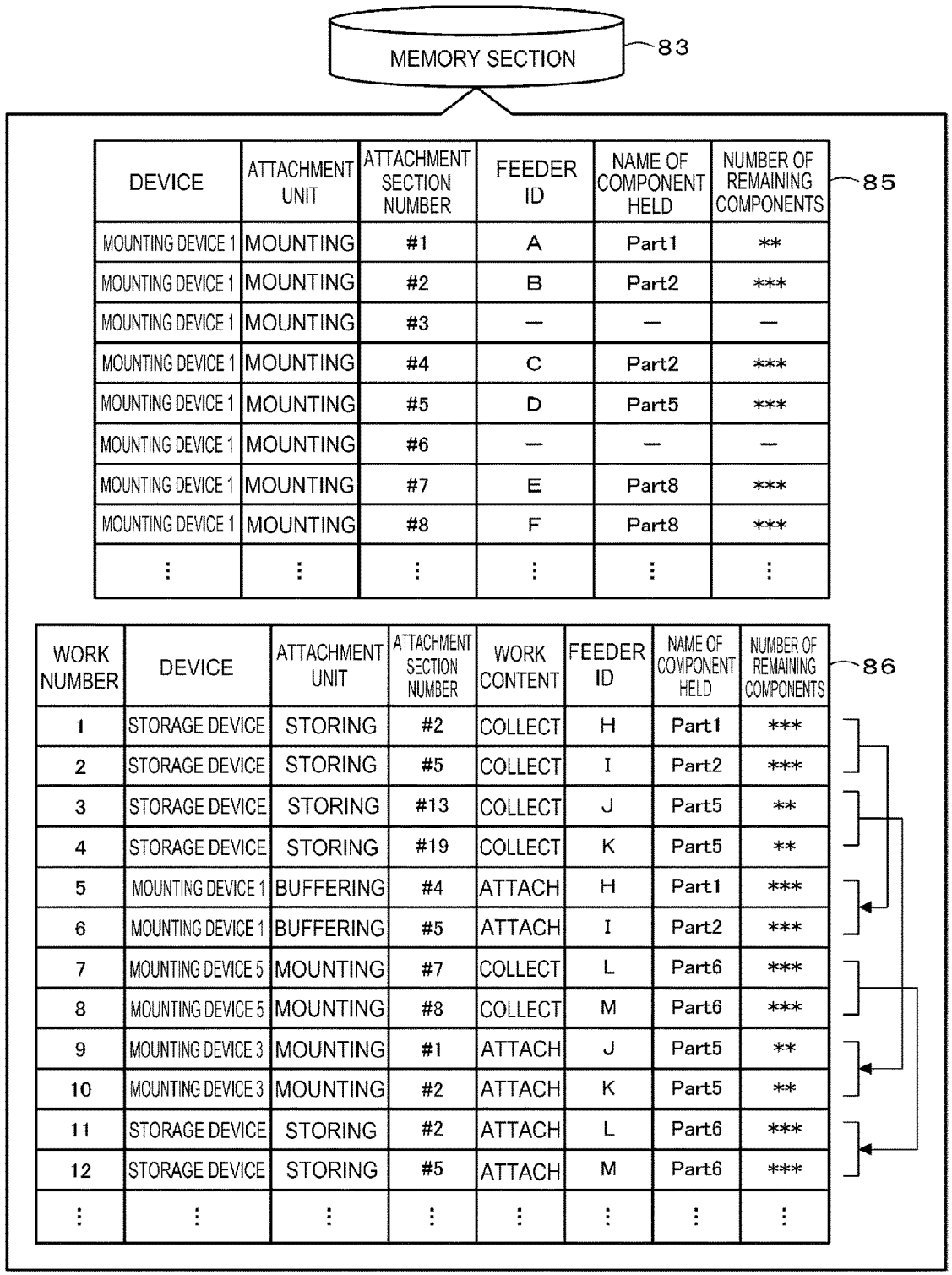
FIG. 3 is an explanatory diagram illustrating an example of information stored in memory section 83 of management device 19.

Hereinafter, the present embodiment will be described referring to drawings. FIG. 1 is a configuration diagram schematically illustrating the configuration of mounting system 10 according to the present disclosure. FIG. 2 is a configuration diagram schematically illustrating the configuration of mounting device 15 and loader 18 serving as a moving work device. FIG. 3 is an explanatory diagram illustrating an example of disposition state information 85 and instruction list information 86 stored in memory section 83 of management device 19. In the present embodiment, a left-right direction (X-axis direction), a front-rear direction (Y-axis direction), and an up-down direction (Z-axis direction) are as illustrated in FIGS. 1 to 3.

For example, in mounting system 10, a device for mounting components on substrate S as a mounting target is configured as a production line arranged in the conveyance direction of substrate S. Here, the mounting target is described as substrate S, but the present disclosure is not limited thereto as long as components are mounted on substrate S, and may be a substrate having a three-dimensional shape. As illustrated in FIG. 1, mounting system 10 includes printing device 11, print inspection device 12, multiple mounting devices 15a to 15e, storage device 16, loader 18, management device 19, and the like. In the present embodiment, mounting system 10 is managed by integration device 90 together with other mounting systems.

Printing device 11 is a device that prints a solder paste or the like on substrate S. Print inspection device 12 is a device for inspecting a state of the printed solder. Multiple mounting devices 15a to 15e are arranged in this order from the upstream side in the conveyance direction of substrate S (the X-axis direction). Hereinafter, mounting devices 15a to 15e may be collectively referred to as mounting device 15. The number of mounting devices 15 is not limited to five, and may be four or less, or may be six or more.

Mounting device 15 is a device for picking up components and mounting the same on substrate S. As illustrated in FIG. 2, mounting device 15 includes mounting control section 20, memory section 23, substrate processing section 26, supply section 27, mounting section 30, power transmitting section 34, and communication section 35. Mounting control section 20 is configured as a microprocessor centered on CPU 21, and controls the entire device. Mounting control section 20 outputs control signals to substrate processing section 26, supply section 27, and mounting section 30, and inputs signals from substrate processing section 26, supply section 27, and mounting section 30. Memory section 23 is, for example, an HDD or an SSD, and is a device that stores various data such as a processing program. Mounting condition information 24, disposition state information 25, and the like are stored in memory section 23. Mounting condition information 24 is a production job, and includes information such as information of components, a disposition order in which the components are mounted on substrate S, a disposition position, and an attachment position (attachment section number) of feeder 17 from which the components are picked up. Mounting condition information 24 such as a pick-up order and a disposition order having a high mounting efficiency is created by management device 19, transmitted from management device 19, and stored in memory section 23. Disposition state information 25 is the same information as disposition state information 85 stored in memory section 83 of management device 19. Details of disposition state information 85 will be described later. Mounting device 15 acquires mounting condition information 24 from management device 19, and creates disposition state information 25 by itself. Communication section 35 is an interface for exchanging information with an external device such as management device 19.

Substrate processing section 26 is a unit that carries in, conveys, and fixes and carries out substrate S at a mounting position. Substrate processing section 26 has a pair of conveyor belts that are provided with intervals in the front-rear direction in FIG. 1 and spanned in the left-right direction. Substrate S is conveyed by the conveyor belts.

Supply section 27 is a unit for supplying components to mounting section 30. This supply section 27 attaches feeder 17 including a reel around which a tape serving as a holding member holding components is wound to each attachment section 29. Supply section 27 includes two upper and lower attachment units on which feeder 17 is attachable ahead of each other. The upper stage is attachment unit 28a for mounting from which a component can be picked up by mounting section 30, and the lower unit is attachment unit 28b for buffering from which a component cannot be picked up by mounting section 30. Hereinafter, attachment unit 28a for mounting and attachment unit 28b for buffering, and attachment unit 40 for storing (refer to FIG. 1) of storage device 16 may be collectively referred to as an attachment unit. Each of attachment unit 28a for mounting and attachment unit 28b for buffering includes multiple attachment sections 29 formed in an L shape in the X direction and arranged in the X direction at predetermined intervals. Respective attachment sections 29 include slot 29a into which a rail member of feeder 17 is inserted, and connecting section 29b into which a connector provided at the distal end of feeder 17 is inserted. Feeder 17 includes a controller (not illustrated). This controller stores information such as identification information (ID) of the tape included in feeder 17, a component type, and the number of remaining components. When feeder 17 is coupled to connecting section 29b, this controller transmits the information of feeder 17 to mounting control section 20.

Mounting section 30 is a unit that picks up components from supply section 27 and disposes the components on substrate S fixed to substrate processing section 26. Mounting section 30 includes head moving section 31, mounting head 32, and nozzle 33. Head moving section 31 includes a slider guided by a guide rail and moving in an XY direction, and a motor for driving the slider. Mounting head 32 picks up one or more components and moves the same in the XY direction by head moving section 31. Mounting head 32 is detachably attached to the slider. One or more nozzles 33 are detachably attached to the lower surface of mounting head 32. Nozzle 33 picks up a component by using a negative pressure. Instead of nozzle 33, a pickup member that picks up a component may be a mechanical chuck or the like that mechanically holds a component.

Power transmitting section 34 is configured to transmit electric power in a non-contact manner to power receiving section 57 of loader 18 when loader 18 approaches, for example, when loader 18 faces each other in the Y-axis direction. Power transmitting section 34 includes a power transmitting section having a power transmission coil or the like, and is supplied with electric power from a power source (not illustrated).

Mounting device 15 further includes door section 36a that opens and closes an opening section on the upper side of supply section 27 on the front surface of housing 36 that accommodates substrate processing section 26, supply section 27, mounting section 30, power transmitting section 34, and the like. The operator can open this door section 36a to perform an operation in housing 36. An opening/closing sensor for sensing the opening and closing of door section 36a is attached to door section 36a, and mounting device 15 can sense the opening and closing of door section 36a.

As illustrated in FIG. 1, storage device 16 is a storing place for storing a feeder 17 used in each mounting device 15. Storage device 16 is provided below the conveyance device between print inspection device 12 and mounting device 15a of multiple mounting devices 15 on the most upstream side in the conveyance direction of substrate S. Storage device 16 includes attachment unit 40 for storing and power transmitting section 42. Similar to attachment unit 28a for mounting and attachment unit 28b for buffering, attachment unit 40 for storing is formed in an L-shape in the X direction, and includes multiple attachment sections 41 arranged in the X direction at predetermined intervals. Respective attachment sections 41 include a slot and a connecting section in the same manner as attachment section 29 described above, and feeder 17 is attachable and detachable. Similar to power transmitting section 34 of mounting device 15, power transmitting section 42 is configured to transmit electric power in a non-contact manner to power receiving section 57 of loader 18 when loader 18 approaches, for example, when loader 18 faces each other in the Y-axis direction.

Loader 18 is a moving work device that moves along X-axis rail 18a provided on the front surface of storage device 16 and the front surface of each mounting device 15 in parallel with the conveyance direction (the X-axis direction) of substrate S to automatically attach and detach and collect feeder 17 of storage device 16 and respective mounting devices 15. Loader 18 includes moving control section 50, memory section 53, accommodation section 54, exchange section 55, moving section 56, power receiving section 57, and communication section 58. Moving control section 50 is configured as a microprocessor centered on CPU 51 and controls the entire device. Moving control section 50 outputs control signals to exchange section 55 and moving section 56, and inputs signals from exchange section 55 and moving section 56. The signal from moving section 56 includes a signal from an encoder that detects the current position of loader 18. Memory section 53 is, for example, an HDD or an SSD, and is a device that stores various data such as a processing program. Memory section 53 stores instruction list information 53a and the like. Instruction list information 53a is the same information as instruction list information 86 stored in memory section 83 of management device 19, and is created by management device 19, transmitted from management device 19, and stored in memory section 83. Details of instruction list information 86 will be described later.

Accommodation section 54 has an accommodation space in which feeders 17 are accommodated. Accommodation section 54 is configured to accommodate, for example, four feeders 17. Exchange section 55 is a mechanism that carries feeder 17 in and out and moves feeder 17 to upper and lower stages (refer to FIG. 2). Exchange section 55 has a clamp section for clamping feeder 17, a Y-axis slider for moving the clamp section in the Y-axis direction (the front-rear direction), and a Z-axis slider for moving the clamp section in the Z-axis direction (the up-down direction). Exchange section 55 executes the attachment and collection of feeder 17 in attachment unit 28a for mounting and attachment unit 28b for buffering of each mounting device 15 and attachment unit 40 for storing of storage device 16. Moving section 56 is a mechanism for moving loader 18 in the X-axis direction (left-right direction) along X-axis rail 18a. Power receiving section 57 is configured to receive electric power in a non-contact manner from the power transmitting section of a device that is currently closest to one of storage device 16 and each mounting device 15, for example, a device facing each other in the Y-axis direction. Power receiving section 57 includes a power receiving section having a power receiving coil or the like, and supplies electric power to exchange section 55, moving section 56, and the like. Communication section 58 is an interface for exchanging information with external devices such as management PC 14 and mounting device 15. Loader 18 transmits the current position and the work content of the executed operation to management device 19.

Management device 19 is a device for managing information of each device of mounting system 10. As illustrated in FIG. 1, management device 19 includes management control section 80, memory section 83, communication section 87, display section 88, and input device 89. Management control section 80 is configured as a microprocessor centered on CPU 81, and controls the entire device. Memory section 83 is, for example, an HDD or an SSD, and is a device for storing various data such as a processing program. Communication section 87 is an interface for exchanging information with external devices such as mounting device 15 and loader 18. Display section 88 is a liquid crystal screen for displaying various information. Input device 89 includes a keyboard, a mouse, and the like through which the operator inputs various commands.

As illustrated in FIG. 1, memory section 83 stores mounting condition information 84, disposition state information 85, instruction list information 86, and the like. Mounting condition information 84 is the same data as mounting condition information 24. As illustrated in FIG. 3, disposition state information 85 is information including the type and the usage state of feeder 17 attached to each attachment section 41 and each attachment section 29 of each attachment unit of storage device 16 and each mounting device 15. The usage state of feeder 17 includes a component name, the number of remaining components, and the like. Disposition state information 85 includes information such as a device name, an attachment unit name, an attachment section number, identification information (ID) of feeder 17 attached to attachment section 29, a name of a component held by feeder 17, and the number of remaining components. The device name is information on which one of storage device 16 and each mounting device is. The attachment unit name is information on which of attachment unit 28a for mounting, attachment unit 28b for buffering, and attachment unit 40 for storing is. The attachment section number is information indicating the position of attachment section 41 or attachment section 29. In FIG. 3, with respect to disposition state information 85 and instruction list information 86, the numerals behind the mounting device indicate the number of mounting devices from the upstream side of the production line. For example, in disposition state information 85 of FIG. 3, feeder A is attached to attachment section number #1 of attachment unit 28a for mounting of mounting device 15a (in FIG. 3, mounting device 1). Disposition state information 85 is appropriately updated as to the current contents when feeder 17 is attached or collected in storage device 16 or each mounting device 15 by loader 18 or the operator.

As illustrated in FIG. 3, instruction list information 86 is information used when loader 18 executes the attachment and detachment processing of feeder 17 in storage device 16 or each mounting device 15. Instruction list information 86 includes information such as a name of a device as a work target, an attachment unit name, an attachment section number, a work content, identification information (ID) of feeder 17, a name of a component held by feeder 17, and the number of remaining components. The information other than the work content in instruction list information 86 is the same information as the information of the corresponding name of disposition state information 85. The work content is information on the attachment or collection of feeder 17. In FIG. 3, the state of moving of each feeder 17 is illustrated by arrows for the sake of convenience of description. For example, in work numbers 1 to 4 of instruction list information 86 in FIG. 3, the work for loader 18 to collect feeder 17 with the corresponding feeder ID from attachment section 41 with attachment section numbers #2, #5, #13, and #19 of attachment unit 40 for storing of storage device 16 is regulated. In work numbers and 6, the work for loader 18 to attach feeder 17 collected in work numbers 1 and 2 to attachment section 29 with attachment section numbers #4 and #5 of attachment unit 28b for buffering of mounting device 15a is regulated. In work numbers 9 and 10, the work for loader 18 to attach feeder 17 collected in work numbers 3 and 4 to attachment section 29 with attachment section numbers #1 and #2 of attachment unit 28a for mounting of mounting device 15c is regulated.

In mounting system 10 according to the embodiment configured as described above, mounting device 15 mounts component P on substrate S as follows. When the mounting processing is started, CPU 21 of mounting control section 20 reads mounting condition information 24, and carries and fixes substrate S into substrate processing section 26. Subsequently, CPU 21 causes mounting head 32 to pick up component P from feeder 17 attached to attachment section 29 of supply section 27 based on mounting condition information 24, and dispose the same on substrate S. When the disposition of component P with respect to substrate S is completed, CPU 21 causes substrate processing section 26 to discharge substrate S, and carries next substrate S into substrate processing section 26. CPU 21 manages the number of components used by each feeder 17 during the execution of the mounting processing, and transmits the information to management device 19 when the number of remaining components is equal to or less than a predetermined value. Management device 19 performs processing for adding an exchange work of feeder 17 whose number of remaining components is equal to less than a predetermined value, that is, feeder 17 that is running short of components, to instruction list information 86. Management device 19 causes loader 18 to execute the exchange work of feeder 17 based on instruction list information 86. Loader 18 moves between storage device 16 and each mounting device 15 along X-axis rail 18a, and executes the exchange work of feeder 17 in storage device 16 or mounting device 15 as a work target while transmitting the current position acquired by using the encoder to management device 19.

Figure 4:
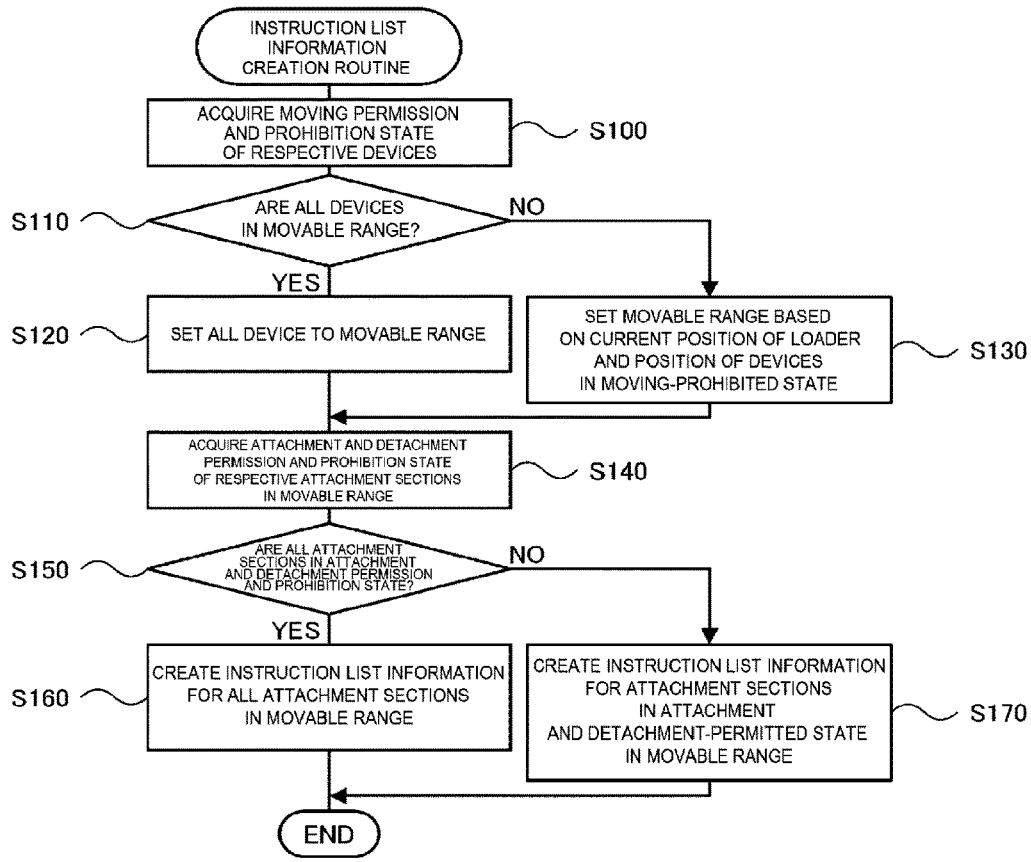
FIG. 4 is a flowchart illustrating an example of an instruction list information creation routine.

Next, the operation of mounting system 10 according to the embodiment configured as described above, particularly, the operation at the time of creating instruction list information 86 will be described. FIG. 4 is a flowchart illustrating an example of an instruction list information creation routine executed by CPU 81 of management control section 80 of management device 19. This routine is stored in memory section 83 of management device 19, and is executed, for example, when the work permission and prohibition state of storage device 16 or each mounting device 15 with respect to loader 18 changes. Although the details of the work permission and prohibition state will be described later, the work permission and prohibition state includes a moving permission and prohibition state with respect to the moving of loader 18, and an attachment and detachment permission and prohibition state with respect to the attachment and detachment processing of feeder 17 by loader 18. In parallel with the present routine, the exchange work of feeder 17 with the number of remaining components equal to or less than the predetermined value is added to instruction list information 86, or when the work of instruction list information 86 is performed by loader 18 or the operator, the work is deleted from instruction list information 86.

When the instruction list information creation routine of FIG. 4 is executed, CPU 81 first acquires a moving permission and prohibition state of storage device 16 and each mounting device 15 with respect to the moving of loader 18 (S100). As for the moving permission and prohibition state of storage device 16, CPU 81 acquires the state determined in parallel with the present routine, and as for the moving permission and prohibition state of respective mounting devices 15, acquires the state determined by CPU 21 of respective mounting control sections 20 and transmitted to management device 19.

CPU 81 determines that storage device 16 is in a moving-permitted state when allowing loader 18 to move the front surface of storage device 16 along the X-axis direction, and determines that storage device 16 is in a moving-prohibited state when prohibiting such moving of loader 18. Such moving of loader 18 is prohibited when electric power cannot be transmitted from power transmitting section 42 to power receiving section 57 of loader 18, or when the power supply of storage device 16 is turned off.

CPU 21 determines that mounting device 15 is in a moving-permitted state when allowing loader 18 to move the front surface of mounting device 15 along the X-axis direction, and determines that mounting device 15 is in a moving-prohibited state when prohibiting such moving of loader 18. Such moving of loader 18 is prohibited when electric power cannot be transmitted from power transmitting section 34 to power receiving section 57 of loader 18, when the opening and closing sensor is detecting the opening of door section 36a, when the power supply of mounting device 15 is turned off, or the like. When the power supply of mounting device 15 is turned off, the moving permission and prohibition state cannot be transmitted from mounting device 15 to management device 19. Therefore, CPU 81 regards mounting device 15 for which the moving permission and prohibition state cannot be acquired as a moving prohibition state.

Subsequently, CPU 81 determines whether or not all of storage device 16 and each mounting device 15 are in a moving-permitted state (S110), and when it is determined that all of storage device 16 and each mounting device 15 are in a moving-permitted state, sets all of storage device 16 and each mounting device 15 in the movable range of loader 18 (S120).

Figure 5A:
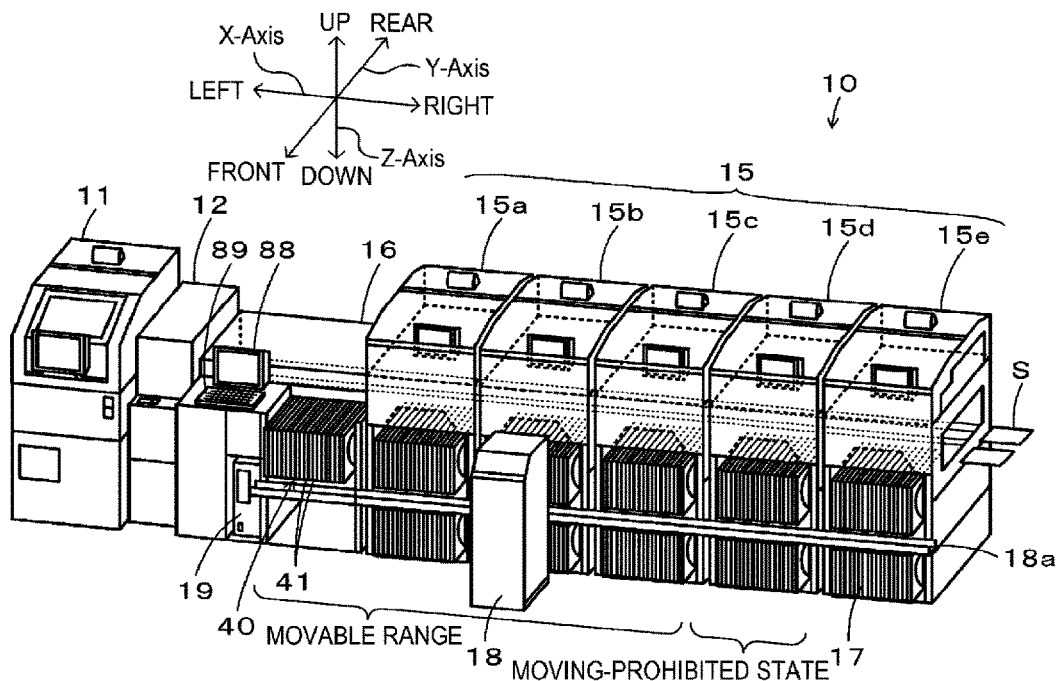
FIG. 5A is an explanatory diagram illustrating an example of a movable range of loader 18.
Figure 5B:
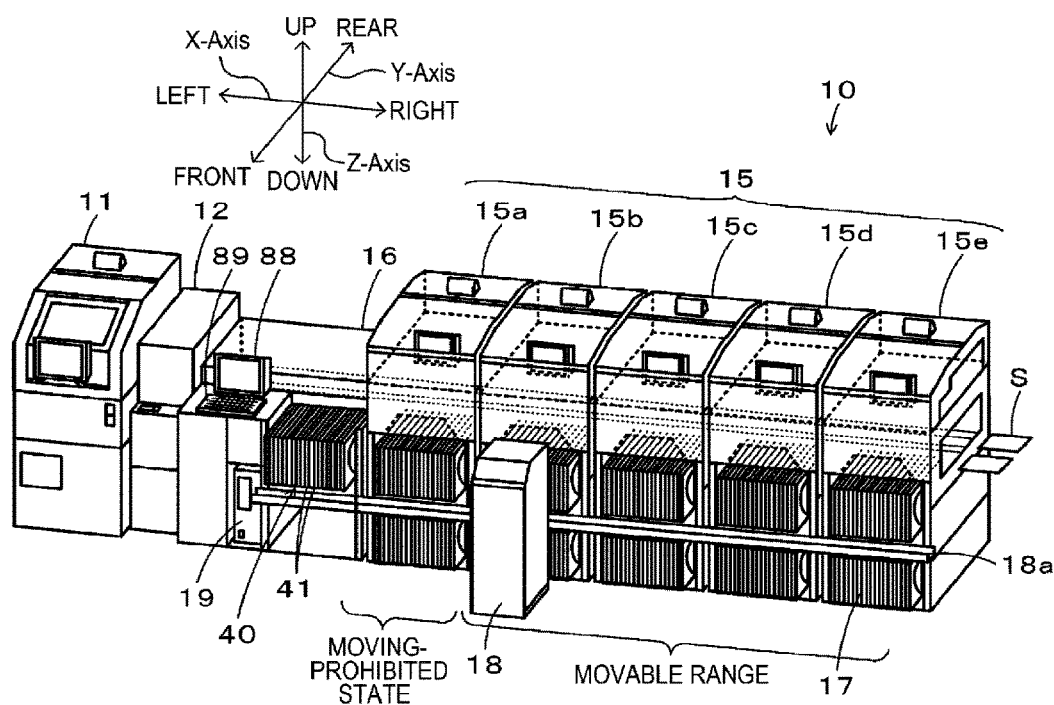
FIG. 5B is an explanatory diagram illustrating an example of a movable range of loader 18.

When it is determined in S110 that a part of storage device 16 and each mounting device 15 is in a moving-prohibited state, CPU 81 sets the movable range of loader 18 based on the current position of loader 18 and the positions of the devices in the moving-prohibited state (S130). FIGS. 5A and 5B are explanatory diagrams illustrating an example of the movable range of loader 18 in a case where a part of storage device 16 and each mounting device 15 is in a moving-prohibited state. FIG. 5A illustrates a case where mounting device 15d is in a moving-prohibited state, and FIG. 5B illustrates a case where mounting device 15a is in a moving-prohibited state. In the case of FIG. 5A, CPU 81 sets storage device 16 and mounting devices 15a to 15c in the movable range of loader 18. In the case of FIG. 5B, CPU 81 sets mounting devices 15b to 15e in the movable range of loader 18. Thereafter, when all of storage device 16 and respective mounting devices 15 are placed in a moving-permitted state from the state of FIG. 5A and FIG. 5B, CPU 81 sets all of storage device 16 and respective mounting devices 15 to the movable range of loader 18 (S120).

Subsequently, in step S140, the CPU 81 acquires the attachment and detachment permission and prohibition state of the attachment sections of respective devices in the movable range of loader 18 among storage device 16 and respective mounting devices 15 with respect to the attachment and detachment processing of feeder 17 by loader 18. As for the attachment and detachment permission and prohibition state of respective attachment sections 41 of storage device 16, CPU 81 acquires the state acquired in parallel with the present routine, and as for the attachment and detachment permission and prohibition state of respective attachment sections 29 of respective mounting devices 15, acquires the state acquired by CPU 21 of respective mounting control sections 20 and transmitted to management device 19.

Among respective attachment sections 41 of attachment unit 40 for storing, CPU 81 acquires the attachment sections in which feeder 17 is not attachable to and detachable from by loader 18 as attachment sections in an attachment and detachment-prohibited state, and acquires the other attachment sections as attachment sections in an attachment and detachment-permitted state. For example, when attachment unit 40 for storing is detached, CPU 81 acquires all attachment sections 41 of attachment unit 40 for storing as attachment sections in an attachment and detachment-prohibited state. In addition, in a case where a failure has occurred in a part of attachment sections 41, such as a failure that makes it difficult to attach and detach feeder 17, CPU 81 acquires the attachment sections 41 in which the failure has occurred as attachment sections in an attachment and detachment-prohibited state. Further when the operator specifies a part of attachment sections 41 by operating input device 89 of management device 19, CPU 81 acquires attachment sections 41 specified by the operator as attachment sections in an attachment and detachment-prohibited state.

Among respective attachment sections 29 of attachment unit 28a for mounting and attachment unit for buffering 28b, CPU 21 acquires the attachment sections which feeder 17 is not attachable to and detachable from by loader 18 as attachment sections in an attachment and detachment-prohibited state, and acquires the other attachment sections as attachment sections in an attachment and detachment-permitted state. For example, when attachment unit for mounting 28a or attachment unit 28b for buffering is detached, CPU 21 acquires all attachment sections 29 of the detached attachment units as attachment sections in an attachment and detachment-prohibited state. In addition, in a case where a failure has occurred in a part of attachment sections 29, such as a failure that makes it difficult to attach and detach feeder 17, CPU 21 acquires attachment sections 29 in which the failure has occurred as attachment sections in an attachment and detachment-prohibited state. In addition, when the operator operates the operation section of mounting device 15 to specify a part of attachment sections 29, CPU 21 acquires attachment sections 29 specified by the operator as attachment sections in an attachment and detachment-prohibited state.

Subsequently, in step S150, among storage device 16 and respective mounting devices 15, CPU 81 determines whether all attachment sections of respective devices within the movable range of loader 18 are in an attachment and detachment-permitted state. When determining that all attachment sections of respective devices within the movable range of loader 18 are in an attachment and detachment-permitted state, CPU 81 creates instruction list information 86 for all attachment sections of the respective devices within the movable range of loader 18 (S160), and ends the present routine. When creating instruction list information 86, CPU 81 stores created instruction list information 86 in memory section 83 and transmits the same to loader 18. When receiving instruction list information 86, CPU 51 of moving control section 50 of loader 18 causes memory section 53 to store instruction list information 86 as instruction list information 53a, and controls exchange section 55 and moving section 56 by using instruction list information 53a. In this manner, loader 18 executes the attachment and detachment processing of feeder 17 in accordance with instruction list information 53a.

When determining in S150 that the attachment sections of a part of the respective devices within the movable range of loader 18 are in an attachment and detachment-prohibited state, CPU 81 creates instruction list information 86 for only the attachment sections other than the attachment sections in an attachment and detachment-prohibited state, that is, the attachment sections in an attachment and detachment-permitted state within the movable range of loader 18 (S170), and ends the present routine.

CPU 81 can create instruction list information 86 according to the moving permission and prohibition state of the respective devices and the attachment and detachment permission and prohibition state of the respective attachment sections by setting the movable range of loader 18 in S120 or S130 and creating instruction list information 86 in S160 or S170. For example, when the movable range of loader 18 is limited, CPU 81 can create the instruction list information 86 so as not to include a device outside the movable range, and thereafter, when the limitation of the movable range is canceled, can create instruction list information 86 including a device that has returned to the movable range. In addition, when a part of the attachment sections are placed in an attachment and detachment-prohibited state within the movable range of loader 18, CPU 81 can create instruction list information 86 so as not to include the attachment sections, and thereafter, when the attachment sections return to an attachment and detachment-permitted state, can create instruction list information 86 including the attachment sections.

FIG. 6 is an explanatory diagram illustrating an example of a state in which instruction list information 86 is created when the movable range of loader 18 is limited. FIG. 6 illustrates a state in which CPU 81 creates instruction list information 86 on the upper side (the same as FIG. 3), and then mounting device 15d is placed in a moving-prohibited state, and the movable range of loader 18 is limited to storage device 16 and respective mounting devices 15a to 15c (refer to FIG. 5A). In this case, since loader 18 cannot move to mounting devices 15d and 15e, CPU 81 deletes the works of work numbers 7 and 8, deletes the works of work numbers 11 and 12 related thereto (refer to the arrows in FIG. 3), and creates instruction list information 86 on the lower side of FIG. 6. If an attachment and detachment instruction of feeder 17 for the attachment sections outside the movable range of loader 18 is included in instruction list information 86, there would be a case where loader 18 cannot operate in accordance with the instruction list information 86 and stops. On the other hand, in the embodiment, since an attachment and detachment instruction of feeder 17 for the attachment sections outside the movable range of loader 18 is not included in instruction list information 86, CPU 81 can suppress the stoppage of loader 18.

FIG. 7 is an explanatory diagram illustrating an example of a state in which instruction list information 86 is created when a part of the attachment sections within the movable range of loader 18 is placed in an attachment and detachment-prohibited state. FIG. 7 illustrates a state in which CPU 81 creates instruction list information 86 on the upper side (the same as in FIG. 3), and then attachment section 41 with attachment section number #13 of storage device 16 is placed in an attachment and detachment-prohibited state, and loader 18 cannot execute the work of work number 3. In this case, CPU 81 deletes the work of work number 3 and deletes the work of work number 9 (refer to the arrow in FIG. 3) related to the same, thereby creating instruction list information 86 on the lower side of FIG. 7. When an attachment and detachment instruction of feeder 17 for the attachment sections in an attachment and detachment-prohibited state is included in instruction list information 86, there would be a case where loader 18 cannot operate in accordance with instruction list information 86 and stops. On the other hand, in the embodiment, since an attachment and detachment instruction of feeder 17 for the attachment sections in an attachment and detachment-prohibited state is not included in instruction list information 86, CPU 81 can suppress the stoppage of loader 18.

Here, when creating the instruction list information on the lower side of FIGS. 6 and 7, CPU 81 may assign the work numbers as they are or reassign the same. In addition, in the embodiment, CPU 81 leaves the work deleted at this time in memory section 83. As a result, CPU 81 can return the deleted work to instruction list information 86 when the limitation of the movable range of loader 18 is canceled after instruction list information 86 on the lower side of FIG. 6 is created, or when attachment sections 41 in an attachment and detachment-prohibited state returns to an attachment and detachment-permitted state after instruction list information on the lower side of FIG. 7 is created. That is, CPU 81 can create instruction list information 86 including the deleted work. In this case, CPU 81 may return the deleted work to the original order as long as it is possible to return to the original order, or may add the deleted work after the last work of instruction list information 86 on the lower side of FIGS. 6 and 7. CPU 81 may temporarily delete the deleted work from memory section 83.

Here, correspondences between the constituent elements of the present embodiment and constituent elements of the present disclosure will be clarified. Each mounting device 15 and storage device 16 of the present embodiment correspond to the [mounting-related device], loader 18 corresponds to the [moving work device], and management device 19 corresponds to the [management device]. In addition, management control section 80 corresponds to the [management control section].

In management device 19 used in mounting system 10 of the above-described example, management control section 80 of management device 19 sets the movable range of loader 18 according to the moving permission and prohibition state of storage device 16 and respective mounting devices 15, and creates instruction list information 86 only for the attachment sections other than the attachment sections in an attachment and detachment-prohibited state, that is, the attachment sections in an attachment and detachment-permitted state within the movable range of loader 18. As a result, it is possible to suppress the stoppage of loader 18.

It is obvious that the present disclosure is not limited to the above-described embodiment and can be implemented in various aspects as long as the aspects belong to the scope of the present disclosure.

In the above-described embodiment, management device 19 sets the movable range of loader 18 according to the moving permission and prohibition state of storage device 16 and respective mounting devices 15, and creates instruction list information 86 for the attachment sections other than the attachment sections in an attachment and detachment-prohibited state within the movable range of loader 18. However, management device 19 may set the movable range of loader 18 according to the moving permission and prohibition state of storage device 16 and respective mounting devices 15, and may create instruction list information 86 for all the attachment sections within the movable range of loader 18 without considering the attachment and detachment denial state of the respective attachment sections. In this case, it is possible to suppress the stoppage of loader 18 in an attempt to move outside the movable range. In addition, management device 19 may create instruction list information 86 for the attachment sections other than the attachment sections in an attachment and detachment-prohibited state among all the attachment sections of storage device 16 and respective mounting devices 15 without considering the moving permission and prohibition state of storage device 16 and respective mounting devices 15. In this case, it is possible to suppress the stoppage of loader 18 in an attempt to attach and detach feeder 17 to and from the attachment sections in an attachment and detachment-prohibited state.

In the above-described embodiment, management device 19 is configured to create instruction list information 86, but is not limited thereto, and respective mounting devices 15, loader 18, integration device 90, and the like may operate as a management device that creates instruction list information 86.

In the above-described embodiment, management device 19 is configured to transmit instruction list information 86 to loader 18, but is not limited thereto as long as management device 19 can cause loader 18 to execute the attachment and detachment processing, and, for example, management device 19 may output a work instruction included in instruction list information 86 to loader 18 to cause loader 18 to execute the attachment and detachment processing.

In the above-described mounting embodiment, respective mounting devices 15 are configured such that supply section 27 includes attachment unit 28a for mounting and attachment unit 28b for buffering, but may not include attachment unit 28b for buffering.

In the above-described embodiment, mounting system 10 is configured to include printing device 11, print inspection device 12, a conveyance device, respective mounting devices 15, storage device 16, loader 18, and management device 19, but to the extent that the present disclosure can be implemented, some or all of the devices and the loader may be omitted, or, for example, a member storage device that stores members other than feeder 17, a mounting inspection device that inspects the mounting state of components of substrate S and a substrate, a reflow device that performs reflow processing, or the like may be included in addition to some or all of the devices and the loader.

In the above-described embodiment, loader 18 is configured to move between storage device 16 and respective mounting devices 15 to automatically attach and detach feeder 17 to and from storage device 16 and attachment sections 41 and 29 of respective mounting devices 15, but is not limited thereto, and may be configured to move between at least a part of printing device 11, print inspection device 12, respective mounting devices 15, storage device 16, a member storage device, a mounting inspection device, a reflow device, or the like to automatically attach and detach the member to and from the attachment sections. Examples of the member include mounting head 32 and nozzle 33.

In the above-described embodiment, the present disclosure is applied in the form of mounting system 10, but the present disclosure may be in the form of management device 19 or in the form of the management method.

Here, the management device, the mounting system, and the management method according to the present disclosure may be configured as follows. For example, in the management device of the present disclosure, when the operator acquires the prohibition information including information on the attachment sections specified by an operator to prohibit attachment and detachment of the member and/or the prohibition information including information based on the state of the attachment sections of the mounting-related device from the mounting-related device, the management control section may create the instruction list based on the prohibition information, in which an attachment and detachment instruction of the member for the attachment sections other than the attachment sections to and from which the member is not attachable and detachable is registered. Accordingly, it is possible to suppress the unintentional stoppage of the moving work device based on the attachment and detachment prohibition of the member specified by the operator or the state of the attachment sections of the mounting-related device. Here, the information based on the state of the attachment sections of the mounting-related device includes information that the attachment unit having the attachment sections is detached, information that a failure has occurred in the attachment sections, and the like.

In the management device of the present disclosure, when acquiring the prohibition information including information on the attachment sections to and from which the member is not attachable and detachable due to restricted moving of the moving work device from the mounting-related device, the management control section may create the instruction list in which an attachment and detachment instruction of the member for the attachment sections of the mounting-related device within a movable range of the moving work device is registered. Accordingly, it is possible to suppress the unintentional stoppage of the moving work device when the moving of the moving work device is limited. Here, the case where the moving of the moving work device is limited includes a case where a door of the mounting-related device is opened, a case where electric power cannot be supplied to the moving work device from any mounting-related device in a case where the moving work device operates by receiving electric power supplied from respective mounting-related devices, and the like.

In the management device of the present disclosure, when acquiring information that the member is attachable and detachable to and from the attachment sections included in the prohibition information from the mounting-related device, the management control section may create the instruction list including an attachment and detachment instruction for the attachment sections to and from which the member is attachable and detachable. As a result, it is possible to execute the attachment and detachment processing of the member on the attachment sections to and from which the member is attachable and detachable by the moving work device.

In the management device of the present disclosure, the mounting-related device may include a mounting device that mounts a component, and the member may be a feeder that supplies the component. Accordingly, in a case where the moving work device is caused to execute the attachment and detachment of the feeder on the attachment section of the mounting device, it is possible to suppress the unintentional stoppage of the moving work device.

The mounting system of the present disclosure includes multiple mounting-related devices in which a member related to mounting of a component is mounted on one or more attachment sections, a moving work device that moves between the multiple mounting-related devices to automatically attach and detach the member to and from the attachment sections, and a management device according to any one of the above aspects. In the mounting system of the present disclosure, it is possible to suppress unintentional stoppage of the moving work device, similarly to the management device described above.

The management method of the present disclosure is a management method used in a mounting system including multiple mounting-related devices in which a member related to mounting of a component is attached to one or more attachment sections, and a moving work device that moves between the multiple mounting-related devices to automatically attach and detach the member to and from the attachment sections, the management method including, when acquiring prohibition information including information on the attachment sections to and from which the member is not attachable and detachable by the moving work device from the mounting-related device, a step of creating an instruction list based on the prohibition information, in which an attachment and detachment instruction of the member for the attachment sections other than the attachment sections to and from which the member is not attachable and detachable is registered, and causing the moving work device to execute attachment and detachment processing of the member based on the instruction list.

In the management method of the present disclosure, when acquiring prohibition information including information on the attachment sections to and from which the member is attachable and detachable by the moving work device from the mounting-related device, an instruction list is created based on the prohibition information, in which an attachment and detachment instruction of the member for the attachment sections other than the attachment sections to and from which the member is not attachable and detachable is registered, and the moving work device is caused to execute attachment and detachment processing of the member based on the instruction list. Therefore, since the instruction list does not include an attachment and detachment instruction of the member for the attachment sections to and from which the member is not attachable and detachable, it is possible to suppress the unintentional stoppage of the moving work device. Here, the mounting-related device includes, for example, a printing device that prints a viscous fluid on a processing target object, a print inspection device that inspects a printing state or the like, a mounting device that mounts a component, a mounting inspection device that inspects a mounting state or the like, a storage device that stores members used in other mounting-related devices, a conveyance device of the processing target object, a reflow device that performs reflow processing, and the like. Examples of the processing target object include a substrate and a substrate having a three-dimensional structure. In the management method of the present disclosure, various aspects of the management device described above may be adopted, or steps for implementing the functions of the management device described above may be added.

INDUSTRIAL APPLICABILITY

The present disclosure is applicable to the technical field of devices that pick up and mount components.

REFERENCE SIGNS LIST

10: mounting system
11: printing device
12: print inspection device
15: mounting device
16: storage device
17: feeder
18: loader
18a: X-axis rail
19: management device
20: mounting control section
21: CPU
23: memory section
24: mounting condition information
25: disposition state information
26: substrate processing section
27 supply section
28a: attachment unit for mounting
28b: attachment unit for buttering
29: attachment section
29a: slot
29b: connecting section
30: mounting section
31: head moving section
32: mounting head
33: nozzle
34: power transmitting section
35: communication section
36: housing
36a: door section
40: attachment section for storing
41: attachment section
42: power transmitting section
50: moving control section
51: CPU
53: memory section
53a: instruction list information
54: accommodation section
55: exchange section
56: moving section
57: power receiving section
58: communication section
80: management control section
81: CPU
83: memory section
84: mounting condition information
85: disposition state information
86: instruction list information
87: communication section
88: display section
89: input device
90: integration device

The invention claimed is:

1. A management device used in a mounting system including multiple mounting-related devices in which a feeder related to mounting of a component is attached to respective attachment sections of the multiple mounting-related devices, and a loader that moves along a rail provided on front surface of the multiple mounting-related devices between the multiple mounting-related devices to automatically attach and detach the feeder to and from the attachment sections, the management device comprising:
a processor configured to acquire prohibition information including information on at least one attachment section of at least one mounting-related device to and from which the feeder is not attachable and detachable by the loader from the at least one mounting-related device due to restricted moving of the loader from the at least one mounting-related device,
create an instruction list based on the prohibition information, in which an attachment and detachment instruction of the feeder for the attachment sections that are within a movable range of the loader other than the at least one attachment section to and from which the feeder is not attachable and detachable due to the restricted moving of the loader from the at least one mounting-related device is registered,
and cause the moving work device to execute attachment and detachment processing of the feeder based on the instruction list.

2. The management device according to claim 1, wherein the prohibition information includes at least one of information on the attachment sections specified by an operator to prohibit attachment and detachment of the feeder and information based on a state of the attachment sections of the mounting-related devices from the mounting-related device, and
the processor is configured to create the instruction list based on the prohibition information including at least one of the information on the attachment sections specified by an operator to prohibit attachment and detachment of the feeder and the information based on a state of the attachment sections of the mounting-related devices from the mounting-related device.

3. The management device according to claim 1, wherein the processor is configured to create the instruction list including an attachment and detachment instruction for the attachment sections to and from which the feeder is attachable and detachable.

4. The management device according to claim 1, wherein the mounting-related device includes a mounting device that mounts the component, and
the feeder is configured to supply the component.

5. A mounting system comprising:
multiple mounting-related devices in which a feeder related to mounting of a component is attached to respective attachment sections of the multiple mounting-related devices;
a loader configured to move along a rail provided on front surface of the multiple mounting-related devices between the multiple mounting-related devices to automatically attach and detach the feeder to and from the attachment sections; and
the management device according to claim 1.

6. A management method used in a mounting system including multiple mounting-related devices in which a feeder related to mounting of a component is attached to respective attachment sections of the multiple mounting-related devices, and a loader that moves along a rail provided on front surface of the multiple mounting-related devices between the multiple mounting-related devices to automatically attach and detach the feeder to and from the attachment sections, the management method comprising:
acquiring prohibition information including information on at least one attachment section of at least one mounting-related device to and from which the feeder is not attachable and detachable by the loader from the at least one mounting-related device due to restricted moving of the loader from the at least one mounting-related device, creating an instruction list based on the prohibition information, in which an attachment and detachment instruction of the feeder for the attachment sections that are within a movable range of the loader other than the at least one attachment section to and from which the feeder is not attachable and detachable due to the restricted moving of the loader from the at least one mounting-related device is registered, and causing the moving work device to execute attachment and detachment processing of the feeder based on the instruction list.

* * * * *